(12) United States Patent
Shu

(10) Patent No.: US 6,858,377 B2
(45) Date of Patent: Feb. 22, 2005

(54) DUAL DAMASCENE PROCESS USING A SINGLE PHOTO MASK

(75) Inventor: Shih-Chi Shu, Chung-Li (TW)

(73) Assignee: Nanya Technology Corporation, Taoyuan (TW)

( * ) Notice: Subject to any disclaimer, the term of this patent is extended or adjusted under 35 U.S.C. 154(b) by 120 days.

(21) Appl. No.: 10/255,176

(22) Filed: Sep. 24, 2002

(65) Prior Publication Data

US 2003/0207180 A1 Nov. 6, 2003

(30) Foreign Application Priority Data

May 3, 2002 (TW) .......................................... 91109211 A

(51) Int. Cl.$^7$ ................................................. G03F 7/30
(52) U.S. Cl. ...................... 430/314; 430/317; 430/323; 430/324; 438/622; 438/638
(58) Field of Search ................................ 430/311, 314, 430/316, 317, 318, 323, 324; 438/622, 638

(56) References Cited

U.S. PATENT DOCUMENTS 6,180,512 B1 * 1/2001 Dai ............................ 438/627
2003/0027419 A1 * 2/2003 Chen .......................... 438/638

\* cited by examiner

Primary Examiner—John S. Chu
(74) Attorney, Agent, or Firm—Ladas & Parry LLP

(57) ABSTRACT

A dual damascene process using a single photo mask in which a photo mask having patterns with different transparency is applied. A mask layer with a dual layer opening is formed first and then serves as an etching mask to form a dual opening in the dielectric layer. Then a metal layer is filled in the dual layer opening in the dielectric layer to form a dual damascene structure. Therefore, only a single photolithography process is necessary and overlay due to misalignment can be avoided.

20 Claims, 6 Drawing Sheets

DUAL DAMASCENE PROCESS USING A SINGLE PHOTO MASK

BACKGROUND OF THE INVENTION

1. Field of the Invention

The present invention relates to a dual damascene process and, more particularly, to a dual damascene process using a single photo mask.

2. Description of the Related Art

Metallic damascene processes are generally divided to single damascene processes and dual damascene processes. FIG. 1a to FIG. 1c illustrate the dual damascene process in the prior art.

In FIG. 1a, substrate 10 maybe a metal layer or a semiconductor layer. A dielectric layer 12, for example, a silicon dioxide layer, is formed on the surface of the substrate 10 by PECVD, and a first photoresist pattern 14 is formed on the surface of the dielectric layer 12 by a first photolithography process. Then, part of the dielectric layer 12 is removed and a first opening 16 is formed by using the first photoresist pattern 14 as the etching mask.

Then, as shown in FIG. 1b, after the first photoresist pattern 14 is removed, a second photolithography process is applied to form a second photoresist pattern 18 on the dielectric layer 12. Then, part of the dielectric layer 12 in the first opening 16 is removed and a second opening 20 is formed in the first opening 16 by using the second photoresist pattern 18 as the etching mask.

Finally, as shown is FIG. 1c after the second photoresist pattern 18 is removed, a metal layer 22 is filled in the first opening 16 and the second opening 20, thus completing dual damascene process.

According to the above description, photolithography must be applied twice during the dual damascene process. Thus two photo masks (or reticles) must be used: the first photo mask used to define the first opening 16 and the second photo mask used to define the second opening 20. However, if the photolithography process using the second photo mask is misaligned, overlay may occur on the first opening 16 and the second opening 20, thus destroying the profile of the dual damascene structure, as shown in FIG. 2.

Thus the prior dual damascene process has at least the below shortcomings:

(1) due to the use of two photolithography processes, two photo masks with different patterns must be used, thus complicating the process and increasing the cost.

(2) due to the two photolithography processes, misalignment or overlaying can easily occur.

Thus, a dual damascene process using a single photo mask is desired to solve the aforementioned problems.

SUMMARY OF THE INVENTION

The present invention is a dual damascene process using a single photo mask. The process is provided on a substrate having a dielectric layer, a mask layer, and a photoresist layer formed over the surface sequentially. Then a photolithography process is performed with a photo mask to define a photoresist pattern having a first dual layer opening comprising a first opening and a second opening which exposes the surface of the mask layer. Then the mask layer not covered by the photoresist pattern is removed to form a mask pattern having a second dual layer opening comprising a third opening and a fourth opening which exposes the surface of the dielectric layer. Then the surface of the dielectric layer exposed in the fourth opening not covered by the mask pattern is removed to form a contact window in the dielectric layer which exposes the surface of the substrate. Then part of the mask pattern is removed to form a residue mask pattern exposing part of the dielectric layer. Then, part of the dielectric layer not covered by the residue mask pattern is removed to form a trench which constitute a dual opening together with the contact window. Then the mask layer is removed and a conductive layer is formed on the opening.

The photo mask used in the present invention is manufactured by a method comprising: providing a transparent substrate; forming an opaque first pattern on part of the transparent substrate; forming a semiopaque second pattern connected to the first pattern on part of the transparent substrate; and forming a transparent area within the second pattern.

BRIEF DESCRIPTION OF THE DRAWINGS

The following detailed description, given by way of example and not intended to limit the invention solely to the embodiments described herein, will best be understood in conjunction with the accompanying drawings, in which:

FIG. 3b shows the cross-sectional view of the photo mask used in the embodiment taken along the line connecting A and A' in FIG. 3a;

DETAILED DESCRIPTION OF THE INVENTION

Figure 1A:
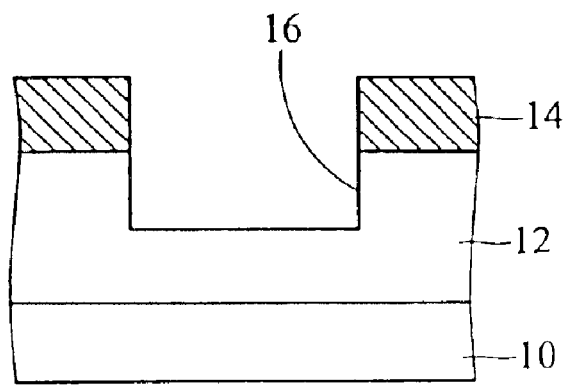
FIG. 1a to 1c show cross-sections of the conventional dual damascene process.
Figure 1B:
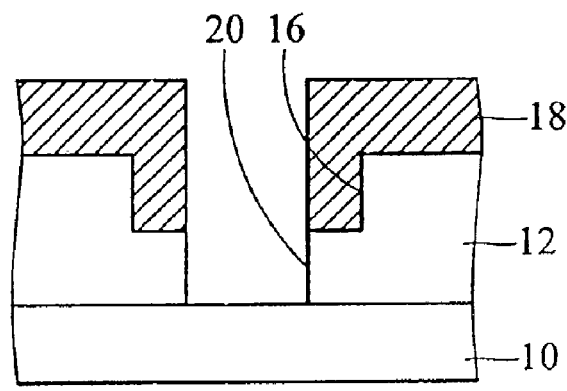
Figure 1C:
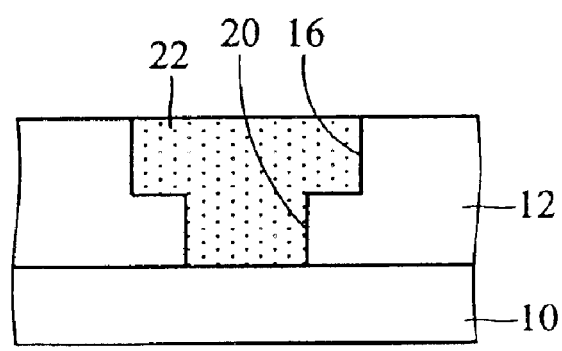
Figure 2:
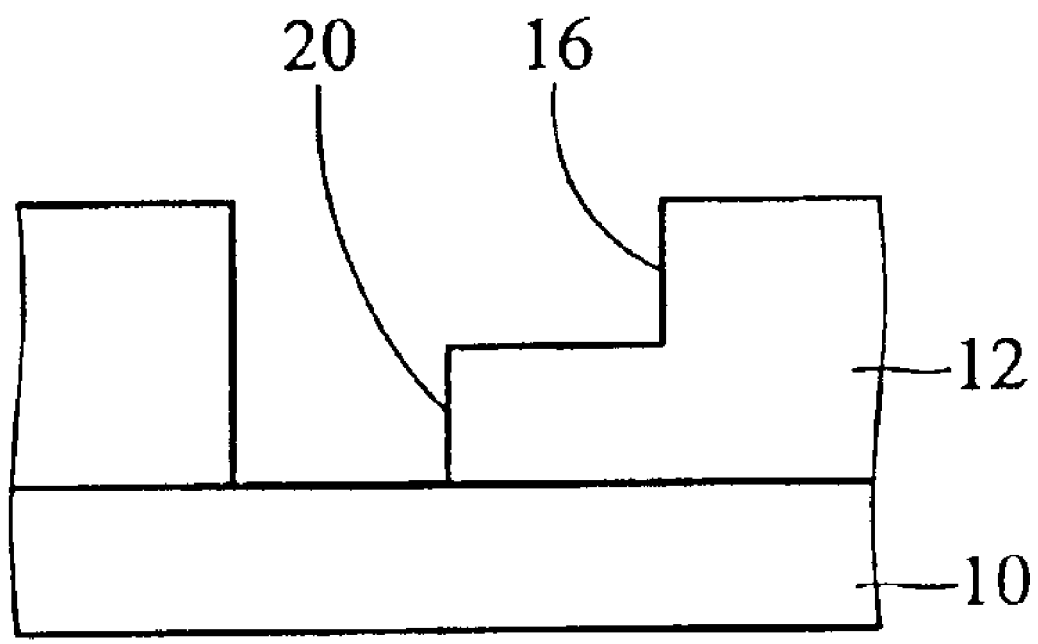
FIG. 2 shows the shortcomings of the prior dual damascene process.
Figure 3A:
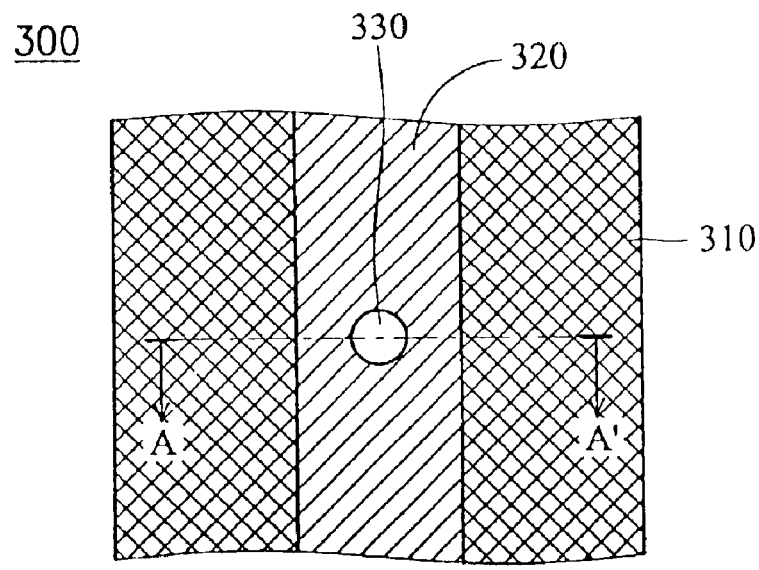
FIG. 3a shows a vertical view of the photo mask used in the embodiment.

A dual damascene process using a single photo mask is provided. FIG. 3a shows a vertical view of the photo mask used in the embodiment, and FIG. 3b shows the cross-sectional view of the photo mask used in the embodiment taken along the line connecting A and A' in FIG. 3a.

Figure 3B:
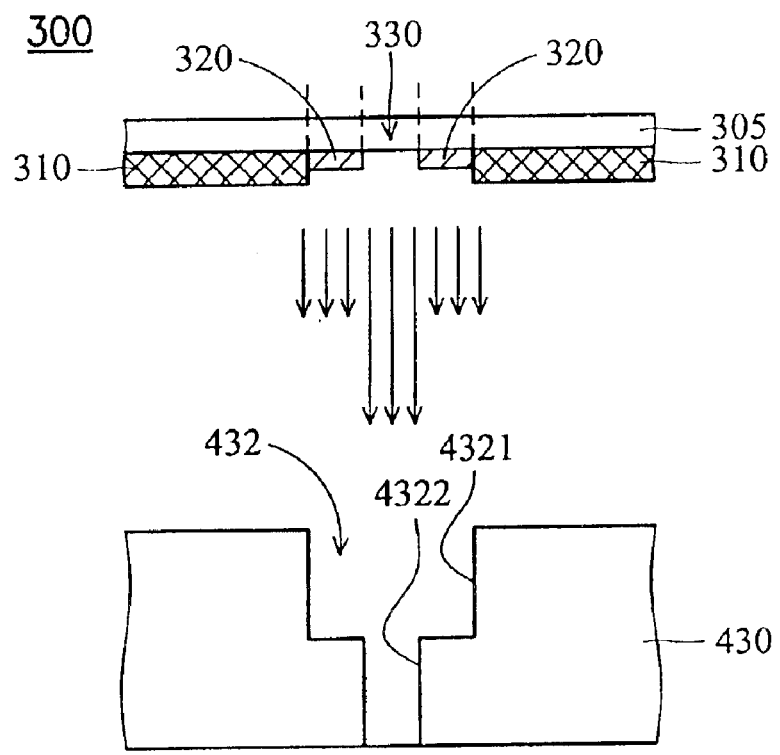

In FIG. 3a to 3b, substrate 305, for example, quartz, serves as the transparent substrate of the photo mask 300. An opaque first pattern 310 of the photo mask 300 is formed on part of the surface of the substrate 305. A semiopaque second pattern 320 of the photo mask 300 is formed connected to the first pattern 310 and also on part of the surface of the substrate 305. A transparent area 330 is formed within the second pattern 320 without any pattern formed therein. The transparency of the second pattern 320 is higher than the first pattern 310, and results in a transparency difference of the photo mask 300, whereby only a single photolithography process need be performed in the dual damascene process to form a dual opening 416 (shown in FIG. 4g). The first pattern 310, for example, is made of opaque chromium; the second pattern 320, for example, is made of semiopaque SiON film or quartz or with a transparency adjusted by a shifter.

Figure 4A:
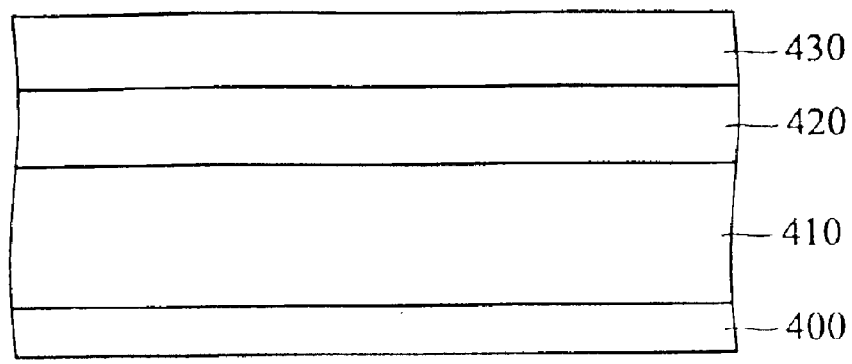
FIG. 4a to 4h show cross-sections of the dual damascene process using a single photo mask.

Next, in FIG. 4a to 4f, cross-sections of the dual damascene process using a single photo mask 300 are shown. In FIG. 4a, a dielectric layer 410, a mask layer 420, and a photoresist layer 430 are formed over the surface of the substrate 400 sequentially, where in the substrate 400 is, for example, metal or semiconductor and the dielectric layer 410 is, for example, $SiO_2$ formed by CVD, and the mask layer 420 is, for example, SiN formed by CVD.

Figure 4B:
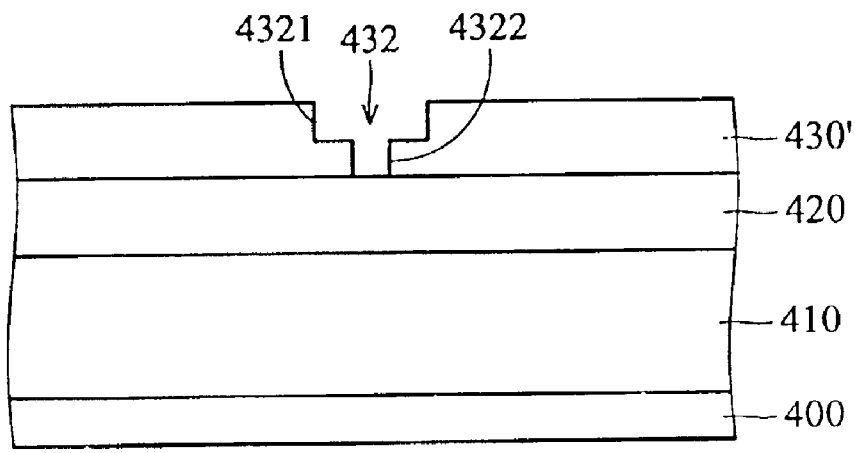

Next, in FIG. 4b, photolithography using the photo mask 300 as shown in FIG. 3a to 3b is applied on the photoresist layer 430 to form a first opening 432 exposing the surface of the mask layer 420 in the photoresist layer 430 and define a photoresist pattern 430'. Referring to FIG. 3b, the second pattern 320 of the photo mask 300 is opposed to the first opening 4321 of the first dual layer opening 432; the transparent area 330 of the photo mask 300 is opposed to the second opening 4322 of the first dual layer opening 432, i.e. wherein the surface of the mask layer 420 is exposed.

Figure 4C:
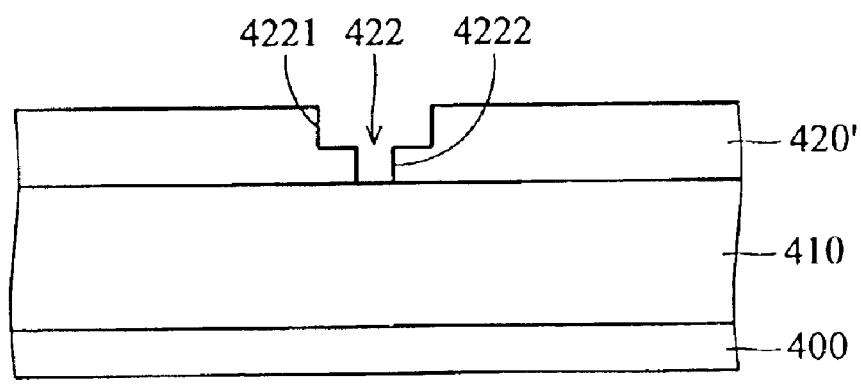

Next, in FIG. 4c, part of the mask layer 420 is removed by etching with the photoresist pattern 430' as the etching mask, and a second dual layer opening 422 is formed in the mask layer 420. Thus, a mask pattern 420' is formed. The second dual layer opening 422 comprises a third opening 4221 and a fourth opening 4222 which expose the surface of the dielectric layer 410. The etching is preferably non-isotropic etching, for example, dry etching. Next, the photoresist pattern 430' is removed to expose the surface of the mask pattern 420'.

Figure 4D:
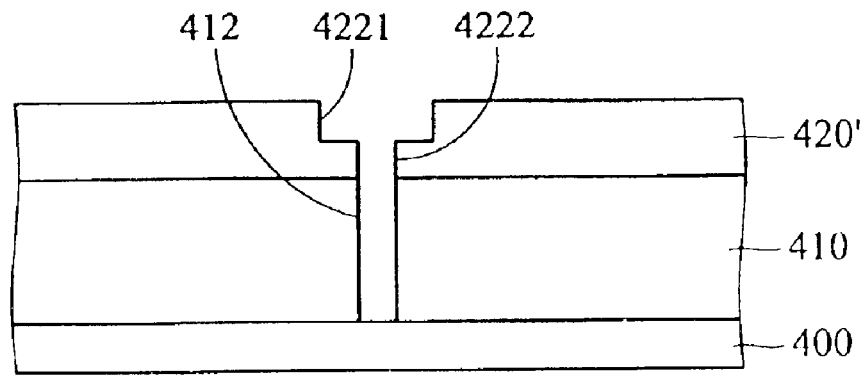

Next, in FIG. 4d, the dielectric layer 410 is removed by etching using the mask pattern 420' as the etching mask, and a contact window 412 which exposes the surface of the substrate 400 is formed in the dielectric layer 410. The etching is preferably non-isotropic etching, for example, dry etching.

Figure 4E:
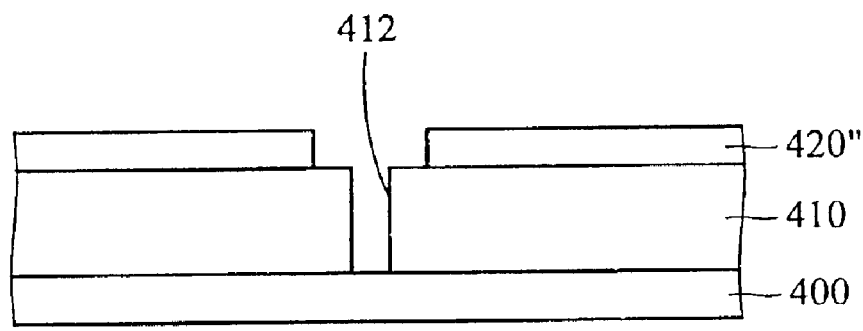

Next, in FIG. 4e, part of the mask pattern 420' is removed by etching to form a residue mask pattern 420" exposing part of the surface of the dielectric layer 410. The etching is preferably non-isotropic etching, for example, dry etching.

Figure 4F:
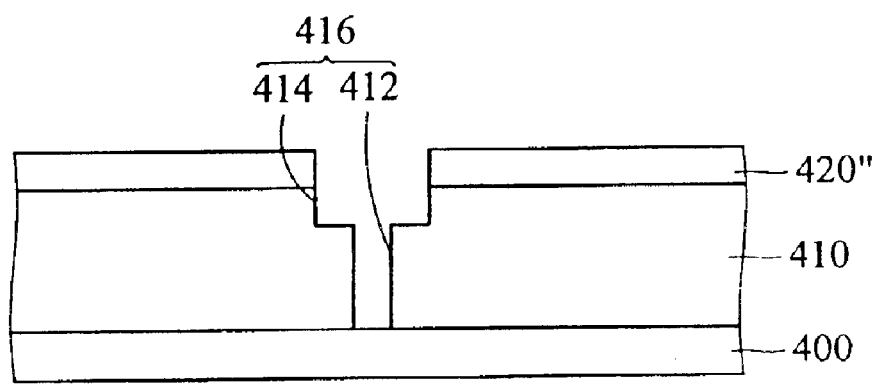

Next, in FIG. 4f, part of the dielectric layer 410 is removed by non-isotropic etching, using the residue mask pattern 420" as the etching mask to form a trench 414 in the dielectric layer 410. The non-soptropic etching may be, for example, dry etching. Therefore a third dual layer opening 416 made of the contact window 412 and the trench 414 is formed.

Figure 4G:
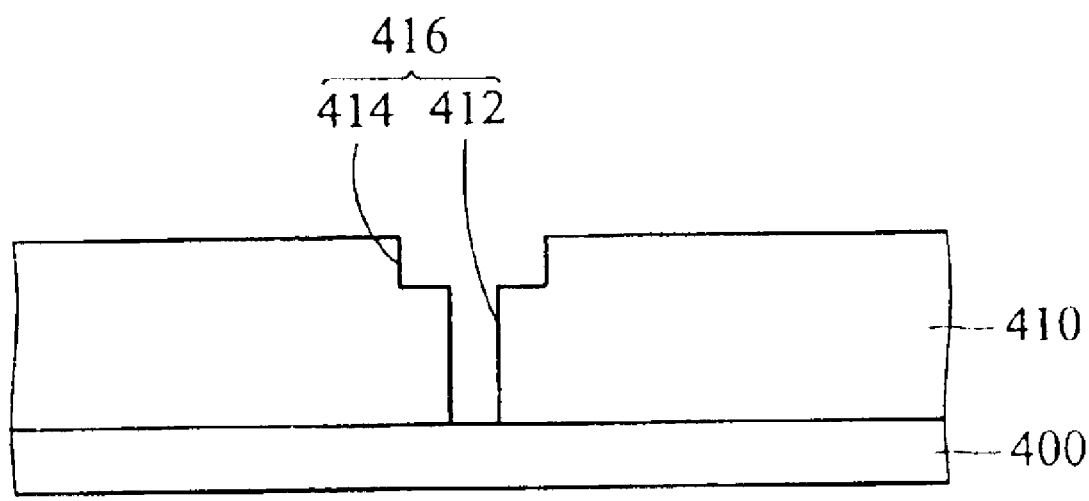

Next, in FIG. 4g, the residue mask pattern 420" is removed to expose the surface of the dielectric layer 410.

Figure 4H:
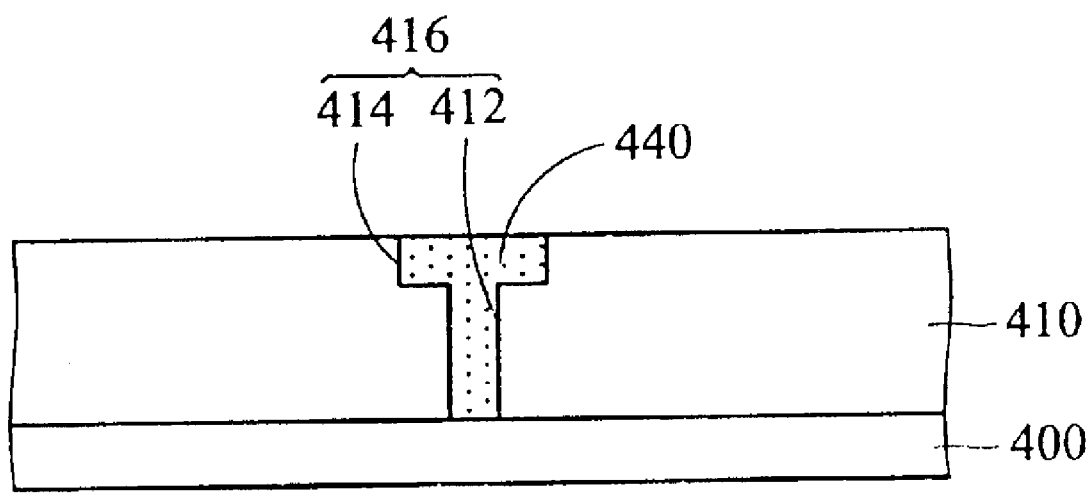

Finally, in FIG. 4h, a conductive layer 440 is filled in the contact window 412 and the trench 414 (i.e. the third dual layer opening 416) to form a dual damascene structure, wherein the conductive layer 440 comprises metallic material, such as copper, aluminum, or tungsten. Further more, CMP can be carried to smooth the surface of the conductive layer 440.

Therefore, according to the present invention, a dual damascene structure can be obtained using only a single photo mask. Thus, the manufacture cost can be lowered and the process can be simplified. In addition, misalignment and overlaying can be avoided by performing a single photolithography process with a single photo mask.

It is to be understood that the present invention is not limited to the embodiments described above, but encompasses any and all embodiments within the scope of the following claims.

What is claimed is:

1. A dual damascene process using a single photo mask, comprising the steps of:
   (a) providing a substrate;
   (b) forming a dielectric layer on the substrate;
   (c) forming a mask layer on the dielectric layer;
   (d) forming a photoresist layer on the mask layer;
   (e) executing photolithography with a photo mask to define a photoresist pattern having a first dual layer opening comprising a first opening and a second opening which expose the surface of the mask layer;
   (f) removing the mask layer not covered by the photoresist pattern to form a mask pattern having a second dual layer opening comprising a third opening and a fourth opening which expose the surface of the dielectric layer;
   (g) removing the surface of the dielectric layer exposed in the fourth opening not covered by the mask pattern to form a contact window in the dielectric layer which exposing the surface of the substrate;
   (h) removing part of the mask pattern to form a residue mask pattern exposing part of the dielectric layer;
   (i) removing part of the dielectric layer not covered by the residue mask pattern to form a trench which constitutes a dual opening together with the contact window;
   (j) removing the mask layer; and
   (k) forming a conductive layer in the opening.

2. The dual damascene process using a single photo mask according to claim 1, wherein the photo mask is manufactured by a method comprising:
   providing a transparent substrate;
   forming an opaque first pattern on part of the transparent substrate;
   forming a semiopaque second pattern connecting to the first pattern on part of the transparent substrate; and
   forming a transparent area within the second pattern.

3. The dual damascene process using a single photo mask according to claim 2, wherein the first pattern is made of chromium.

4. The dual damascene process using a single photo mask according to claim 1, wherein the substrate comprises semiconductor.

5. The dual damascene process using a single photo mask according to claim 1, wherein the substrate comprises metal.

6. The dual damascene process using a single photo mask according to claim 1, wherein the dielectric layer is silicon dioxide.

7. The dual damascene process using a single photo mask according to claim 1, wherein the mask layer is silicon nitride.

8. The dual damascene process using a single photo mask according to claim 1, wherein step (f) is carried out by non-isotropic etching.

9. The dual damascene process using a single photo mask according to claim 1, wherein step (g) is carried out by non-isotropic etching.

10. The dual damascene process using a single photo mask according to claim 1, wherein step (h) is carried out by non-isotropic etching.

11. The dual damascene process using a single photo mask according to claim 1, wherein step (i) is carried out by non-isotropic etching.

12. A dual damascene process using a single photo mask, comprising the steps of:
   (a) providing a substrate;
   (b) forming a dielectric layer on the substrate;
   (c) forming a single mask layer on the dielectric layer;
   (d) forming a photoresist layer on the single mask layer;
   (e) performing photolithography process with a single photo mask to define a photoresist pattern having a first dual layer opening comprising a first opening and a second opening which expose the surface of the single mask layer;

(f) removing the single mask layer not covered by the photoresist pattern to form a mask pattern having a second dual layer opening comprising a third opening and a fourth opening which expose the surface of the dielectric layer;

(g) removing the surface of the dielectric layer exposed in the fourth opening not covered by the mask pattern to form a contact window in the dielectric layer exposing the surface of the substrate;

(h) removing part of the mask pattern to form a residue mask pattern exposing part of the dielectric layer;

(i) removing part of the dielectric layer not covered by the residue mask pattern to form a trench which constitute a dual opening together with the contact window;

(j) removing the mask layer; and (k) forming a conductive layer in the opening, wherein the method of manufacturing the photo mask in step (e) comprises the steps:

(e1) providing a transparent substrate;

(e2) forming an opaque first pattern on part of the transparent substrate;

(e3) forming a semiopaque second pattern connecting to the first pattern on part of the transparent substrate; and (e4) forming a transparent area within the second pattern.

13. The dual damascene process using a single photo mask according to claim 12, wherein the first pattern is made of chromium.

14. The dual damascene process using a single photo mask according to claim 12, wherein the second pattern is made of SiON.

15. The dual damascene process using a single photo mask according to claim 12, wherein the substrate comprises semiconductor.

16. The dual damascene process using a single photo mask according to claim 12, wherein the substrate comprises metal.

17. The dual damascene process using a single photo mask according to claim 12, wherein the dielectric layer is silicon dioxide.

18. The dual damascene process using a single photo mask according to claim 12, wherein step (f) is carried out by non-isotropic etching.

19. The dual damascene process using a single photo mask according to claim 12, wherein step (g) is carried out by non-isotropic etching.

20. The dual damascene process using a single photo mask according to claim 12, wherein step (h) is carried out by non-isotropic etching.

* * * * *